US007844365B2

(12) United States Patent
Brewer et al.

(10) Patent No.: US 7,844,365 B2
(45) Date of Patent: Nov. 30, 2010

(54) FIELD-MOUNTED PROCESS DEVICE

(75) Inventors: John P. Brewer, Chaska, MN (US); Eric D. Rotvold, Inver Grove Heights, MN (US); Robert J. Karschnia, Chaska, MN (US); Marcos Peluso, Chanhassen, MN (US)

(73) Assignee: Rosemount Inc., Eden Prairie, MN (US)

( * ) Notice: Subject to any disclaimer, the term of this patent is extended or adjusted under 35 U.S.C. 154(b) by 0 days.

(21) Appl. No.: 11/184,714

(22) Filed: Jul. 19, 2005

(65) Prior Publication Data
US 2005/0288799 A1 Dec. 29, 2005

Related U.S. Application Data

(63) Continuation-in-part of application No. 10/760,793, filed on Jan. 20, 2004, now Pat. No. 6,961,624, which is a continuation of application No. 10/400,148, filed on Mar. 26, 2003, now Pat. No. 6,711,446, which is a continuation of application No. 09/570,268, filed on May 12, 2000, now Pat. No. 6,574,515.

(51) Int. Cl.
G06F 1/00 (2006.01)
H04M 9/08 (2006.01)
H04M 7/04 (2006.01)
H02J 3/00 (2006.01)
G06F 15/16 (2006.01)

(52) U.S. Cl. .................. 700/270; 713/300; 709/250; 379/398; 379/405; 379/406.02; 379/406.15; 379/413; 307/1; 307/2; 307/10.1; 307/11

(58) Field of Classification Search ............... 700/1–3, 700/27–30, 9, 11, 17, 37, 79, 83, 270; 710/11, 710/12, 16, 38, 105; 714/6, 11; 370/410, 370/437, 493, 468, 352; 709/220, 221, 250; 375/258; 307/1, 2, 10.1, 11; 379/398, 405, 379/406.02, 406.15, 413
See application file for complete search history.

(56) References Cited

U.S. PATENT DOCUMENTS 4,122,719 A  10/1978  Carlson et al. ............ 72/342

(Continued)

FOREIGN PATENT DOCUMENTS

CN  1578455  2/2005

(Continued)

OTHER PUBLICATIONS wikipedia definition for multiplexer and de-multiplexer (http://en.wikipedia.org/wiki/Multiplexer.*

(Continued)

Primary Examiner—Ramesh B Patel
Assistant Examiner—Sunray R Chang
(74) Attorney, Agent, or Firm—Christopher R. Christenson; Westman, Champlin & Kelly, P.A.

(57) ABSTRACT

A field-mounted process device with multiple isolated connections includes a connection that can be an input or an output. The given input or output can couple to multiple sensors or actuators, respectively. The process device can be wholly powered through its communication I/O port. The process device includes a controller adapted to measure one or more characteristics of sensors coupled to an input connection and to control actuators coupled to an output connection. The controller can be further adapted to execute a user generated control algorithm relating process input information with process output commands.

14 Claims, 5 Drawing Sheets

U.S. PATENT DOCUMENTS

| | | | |
|---|---|---|---|
| 4,243,931 A | 1/1981 | dela Cruz | 323/302 |
| 4,413,314 A | 11/1983 | Slater et al. | 341/20 |
| 4,665,393 A * | 5/1987 | Wilder et al. | 340/683 |
| 4,678,937 A | 7/1987 | Price | 307/311 |
| 4,910,658 A | 3/1990 | Dudash et al. | 340/3.54 |
| 4,936,690 A | 6/1990 | Goetzinger | 374/181 |
| 5,051,867 A * | 9/1991 | Burgher et al. | 361/688 |
| 5,307,346 A | 4/1994 | Fieldhouse | 370/254 |
| 5,333,114 A * | 7/1994 | Warrior et al. | 700/67 |
| 5,426,697 A * | 6/1995 | McGrane | 379/398 |
| 5,495,769 A | 3/1996 | Broden et al. | 73/718 |
| 5,551,053 A | 8/1996 | Nadolski et al. | 395/829 |
| 5,706,007 A | 1/1998 | Fragnito et al. | 341/155 |
| 5,713,668 A | 2/1998 | Lunghofer et al. | 374/179 |
| 5,737,543 A | 4/1998 | Gavin et al. | 710/105 |
| 5,761,208 A * | 6/1998 | Muramatsu | 370/532 |
| 5,764,891 A * | 6/1998 | Warrior | 710/72 |
| 5,825,664 A | 10/1998 | Warrior et al. | 364/550 |
| 5,876,122 A | 3/1999 | Eryurek | 374/183 |
| 5,936,514 A * | 8/1999 | Anderson et al. | 323/234 |
| 5,960,214 A | 9/1999 | Sharpe et al. | 710/15 |
| 5,980,078 A | 11/1999 | Krivoshein et al. | 700/1 |
| 5,994,998 A * | 11/1999 | Fisher et al. | 375/258 |
| 6,014,612 A * | 1/2000 | Larson et al. | 702/183 |
| 6,016,523 A | 1/2000 | Zimmerman et al. | 710/63 |
| 6,026,352 A | 2/2000 | Burns et al. | 700/1 |
| 6,035,240 A | 3/2000 | Moorehead et al. | 700/2 |
| 6,047,222 A * | 4/2000 | Burns et al. | 700/79 |
| 6,052,655 A | 4/2000 | Kobayashi et al. | 702/184 |
| 6,076,171 A * | 6/2000 | Kawata | 713/501 |
| 6,088,665 A | 7/2000 | Burns et al. | 702/188 |
| 6,094,600 A | 7/2000 | Sharpe et al. | 700/19 |
| 6,104,895 A | 8/2000 | Gallagher et al. | 717/168 |
| 6,140,911 A * | 10/2000 | Fisher et al. | 375/258 |
| 6,192,281 B1* | 2/2001 | Brown et al. | 700/2 |
| 6,233,626 B1 | 5/2001 | Swales et al. | 710/11 |
| 6,260,004 B1* | 7/2001 | Hays et al. | 702/183 |
| 6,337,856 B1* | 1/2002 | Schanhals et al. | 370/352 |
| 6,360,277 B1 | 3/2002 | Ruckley et al. | 709/250 |
| 6,370,448 B1 | 4/2002 | Eryurek | 700/282 |
| 6,377,859 B1* | 4/2002 | Brown et al. | 700/79 |
| 6,490,177 B1* | 12/2002 | Figueroa | 363/21.03 |
| 6,535,983 B1 | 3/2003 | McCormack et al. | |
| 6,574,515 B1* | 6/2003 | Kirkpatrick et al. | 700/19 |
| 6,640,308 B1* | 10/2003 | Keyghobad et al. | 713/300 |
| 6,711,446 B2* | 3/2004 | Kirkpatrick et al. | 700/19 |
| 6,757,725 B1 | 6/2004 | Frantz et al. | 709/223 |
| 6,780,047 B1* | 8/2004 | Laity et al. | 439/501 |
| 6,788,980 B1 | 9/2004 | Johnson | 700/1 |
| 6,961,624 B2* | 11/2005 | Kirkpatrick et al. | 700/19 |
| 7,016,741 B2* | 3/2006 | Arntson | 700/19 |
| 7,020,532 B2 | 3/2006 | Johnson et al. | 700/1 |
| 7,046,983 B2* | 5/2006 | Elkayam et al. | 455/402 |
| 2002/0010518 A1 | 1/2002 | Reid et al. | 700/31 |
| 2004/0158334 A1 | 8/2004 | Kirkpatrick et al. | 700/27 |
| 2005/0130605 A1 | 6/2005 | Karschnia et al. | 455/90.3 |
| 2006/0218422 A1* | 9/2006 | Camagna et al. | 713/300 |
| 2007/0019560 A1 | 1/2007 | Brewer et al. | 370/252 |
| 2007/0057783 A1 | 3/2007 | Reller | |

FOREIGN PATENT DOCUMENTS

| | | |
|---|---|---|
| DE | 297 20 492 U1 | 2/1998 |
| EP | 0 601 344 A1 | 6/1994 |
| EP | 0 666 631 A2 | 1/1995 |
| EP | 0782297 | 7/1997 |
| GB | 2 329 039 | 3/1999 |
| JP | 52-108194 | 9/1977 |
| JP | 07162345 A | 6/1995 |
| WO | WO 00/64099 | 10/2000 |

OTHER PUBLICATIONS wikipedia definition: (http://en.wikipedia.org/wiki/Wireless_LAN).*
"Power Over Ethernet," http://de.wikipedia.org/wiki/Power_over_Ethernet.
International Search Report and Written Opinion from application No. PCT/US2006/023942 filed Jul. 20, 2006.
"New FieldConnex Fieldbus Power Hub Provides Multiple Power Suppli Fieldbus Devices via Digital Data Lines," http://www.am.pepperl-fuchs.com/news/news.asp., pp. 1-5.
"ISIHART™—Distributed HART Multiplexer", http://www.fint.no/fint_products_hart_mux.html.
D5000 Series Users Manual, 23 pages, Revised Jan. 1, 1998.
"ACE pc," Arcom Control Systems, 1 page dated Feb. 23, 2000, downloaded from http://www.arcom.co.uk/products/iep/systems/ace/default.htm.
"Smart Transmitter (HART Protocol) Interface Products," 1770 Communication Products, 2 pages dated Apr. 26, 1999, downloaded from http://www.ab.com/catalogs/html/b112/io/smart.html.
"Smart Head and Rail Mount Temperature Transmitters," Models 644H and 644R, FISHER-ROSEMOUNT Managing the Process Better, pp. 37-52 (1998).
U.S. Appl. No. 10/760,793, filed Jan. 2004, Kirkpatrick et al.
Universal temperature multiplexer for Foundation Fieldbus, Universal converter, analogue, F2D0-TI-Ex8.FF, 2003.
Valve Coupler for Foundation Fieldbus, Manual FD0-VC-Ex4.FF, Nov. 22, 2000.
PROFIBUS-PA Valve Coupler Filed Box, 2002 IS Catalog, 2002.
PROFIBUS-PA Sensor Interface Field Box, 2002 IS Catalog, 2002.
EC-Type Examination Certificate for FD0-VC-Ex4.Pa dated Dec. 18, 1998 (German Language document and apparent English translation).
Supplement to EC-Type Examination Certificate for FD0-VC-Ex.Pa dated Sep. 18, 2000 (German Language document and apparent English translation).
Supplement to EC-Type Examination Certificate for FD0-VC-Ex4.Pa dated Sep. 21, 2000 (German Language document and apparent English translation).
$1^{st}$ Amendment to EC-Type Examination Certificate for FD0-VC-Ex4.Pa dated Dec. 22, 1999 (German Language document and apparent English translation).
"IEEE802.3af Power Over Ethernet: A Radical New Technology," wwww.PowerOverEthernet.com, pp. 1-10.
"Traditional Temperature Monitoring Applications," http://www.rosemount.com/products/temperature/m848arc.html#mounts.
"The Rosemount 3420 Fieldbus Interface Module allows Fieldbus Process Monitoring in ANY Plant!" http://www.rosemount.com/products/accessories/m3420.html.
"A Revolution in Industrial Networking?" http://www.industrialnetworking.co.uk/mag/v9-3/f_poe.html.
Harry Forbes, ARC Insights, "Ethernet Devices Power Up," Insight #2002-46M, Oct. 9, 2002.
"Power Over Ethernet Specification Approved IEEE 802.3af Gives Hope to Device-Level Ethernet," http://www.manufacturing.net/ctl/article/CA318961?text=poe&spacedesc=news.
"Article: Powered Ethernet Spells Out Change For Field Devices," http://ethernet.industrial-networking.com/articles/i17fielddevices.asp.
"Fieldbus Interface Module," Emerson Process Management, Product Data Sheet, Jul. 2004.
"POE—Power Over Ethernet," http://www.altair.org/labnotes_POE.html.
"Fieldbus Interface Module," Emerson Process Management, Product Data Sheet, Jul. 2004.
"Model 848T Eight Input Temperature Transmitter with FOUNDATION™ Fieldbus," Product Data Sheet 00813-0100-4697, Mar. 2003.
Office Action from Chinese Patent Office in related Chinese application.

"Invitation to Pay Additional Fees," PCT/US2006/028065, filed Jul. 19, 2006.

First Communication for European Patent Application 06 788 153.2, filed Jul. 20, 2006.

First Office Action issued in U.S. Appl. No. 11/489,931, dated Dec. 30, 2008.

Communication report from European patent application 06 787 883.5, dated Feb. 11, 2009.

Office Action from U.S. Appl. No. 11/184,730, dated Mar. 31, 2009.

Communication for European patent application 06 773 602.5, dated May 26, 2009.

First Office Action for Chinese patent application No. 200680025970.0, dated Aug. 21, 2009.

First Office Action for Chinese patent application No. 200680026376.3, dated Aug. 28, 2009.

"The Study on Power Over Ethernet (POE)) Technology," Process Automation Instrumentation, Jan. 2005, vol. 26, No. 1, p. 5-8.

Second Office Action for Russian patent application No. 2008106473, dated Oct. 6, 2009.

Rejection Decision issued by the Chinese Patent Office for Chinese patent application No. 200680025970.0, dated Feb. 5, 2010.

First Examination Opinion for Chinese patent application No. 200680026507.8, dated Apr. 10, 2009.

Second Examination Opinion for Chinese patent application No. 200680026507.8, dated Aug. 21, 2009.

Summons to attend oral proceedings for European patent application No. 06788153.2, dated Dec. 8, 2009.

First Office Action for Russian patent application No. 2008106473, dated May 28, 2009.

Third Office Action for Russian patent application No. 2008106473, dated Jan. 18, 2010.

International Search Report and Written Opinion for patent application No. PCT/US2006/028429, dated Nov. 16, 2006.

* cited by examiner

FIELD-MOUNTED PROCESS DEVICE

The present application is a Continuation-In-Part application of U.S. patent application Ser. No. 10/760,793, filed Jan. 20, 2004 now U.S. Pat. No. 6,961,624 entitled Two-Wire Field-Mounted Process Device, which application is a continuation of U.S. patent application Ser. No. 10/400,148, filed Mar. 26, 2003, now U.S. Pat. No. 6,711,446 entitled Two-Wire Field-Mounted Process Device, which application is a continuation of and claims priority of U.S. patent application Ser. No. 09/570,268, filed May 12, 2000 now U.S. Pat. No. 6,574,515.

BACKGROUND OF THE INVENTION

The present invention relates to process devices. More specifically, the present invention relates to field-mounted process control and measurement devices.

Process devices are used to measure and control industrial processes such as the refining of petrochemicals, the processing of food, the generation of electric power, and a number of other processes. Process measurement devices include process variable transmitters, which measure a process variable such as pressure or temperature and communicate the measured variable to a process controller. Another type of process device is an actuator, such as a valve controller or the like. Generally, process control is accomplished using a combination of transmitters, actuators, and a process controller that communicate across a process control loop to a controller. Both types of process devices interact with the physical process through process interface elements. Process interface elements are devices which relate electrical signals to physical process conditions, and include devices such as sensors, limit switches, valve controllers, heaters, motor controllers, and a number of other devices.

The process controller is typically a microcomputer located in a control room away from the process. The process controller can receive process information from one or more process measurement devices and apply a suitable control signal to one or more process control devices to influence the process and thereby control it.

In order to couple to the process, transmitters and actuators are generally mounted near the process in the field. Such physical proximity can subject the process devices to an array of environmental challenges. For example, process devices are often subjected to temperature extremes, vibration, corrosive and/or flammable environments, and electrical noise. In order to withstand such conditions, process devices are designed specifically for "field-mounting." Such field-mounted devices utilize robust enclosures, which can be designed to be explosion-proof. Further, field-mounted process devices can also be designed with circuitry that is said to be "intrinsically safe", which means that even under fault conditions, the circuitry will generally not contain enough electrical energy to generate a spark or a surface temperature that can cause an explosion in the presence of an hazardous atmosphere. Further still, electrical isolation techniques are usually employed to reduce the effects of electrical noise. These are just a few examples of design considerations, which distinguish field-mounted process devices from other devices, which measure sensor characteristics and provide data indicative of such characteristics.

Aside from the environmental considerations listed above, another challenge for field-mounted devices is that of wiring. Since process devices are located near the process far from the control room, long wire runs are often required to couple such devices to the control room. These long runs are costly to install and difficult to maintain.

One way to reduce the requisite wiring is by using two-wire process devices. These devices couple to the control room using a two-wire process control loop. Two-wire devices receive power from the process control loop, and communicate over the process control loop in a manner that is generally unaffected by the provision of power to the process device. Techniques for communicating over two-wires include 4–20 mA signaling, the Highway Addressable Remote Transducer (HART®) Protocol, FOUNDATION™ Fieldbus, Profibus-PA and others. Although two-wire process control systems provide wiring simplification, such systems provide a limited amount of electrical power to connected devices. For example, a device that communicates in accordance with 4–20 mA signaling must draw no more than 4 mA otherwise the device's current consumption would affect the process variable. The frugal power budget of two-wire process devices has traditionally limited the functionality that could be provided.

Another way the process control industry has reduced field wiring is by providing transmitters with two sensor inputs. Such transmitters reduce the number of transmitters/sensor and thereby reduce wiring costs as well as overall system costs. One example of such a transmitter is the Model 3244MV Multivariable Temperature Transmitter, available from Rosemount Inc., of Eden Prairie, Minn.

Although current multivariable transmitters can reduce wiring costs as well as overall system costs, they have traditionally been limited to applications involving two sensors. Thus, in applications with sixteen sensors, for example, eight multivariable transmitters would still be required. Further, if different sensor groups are independently grounded, there is a possibility that ground loop errors could occur and adversely affect process measurement.

Current methods used to overcome the problem of coupling a large number of sensors to the control room include coupling the sensors directly to the control room. For example, if a situation requires a large number of temperature sensors, consumers generally create "direct run" thermocouple configurations where thermocouple wire spans the distance between the measurement "point" and the control room. These direct run configurations are generally less expensive than the cost of obtaining a number of single or dual sensor transmitters, however, a significant wiring effort is required, and process measurement is rendered more susceptible to electrical noise due to the long runs.

The process control industry has also reduced the effects of long wire runs on process control by providing field-mounted devices that are capable of performing control functions. Thus, some aspects of process control are transferred into the field, thereby providing quicker response time, less reliance upon the main process controller, and greater flexibility. Further information regarding such control functions in a field-mounted device can be found in U.S. Pat. No. 5,825,664 to Warrior et al, entitled FIELD-MOUNTED CONTROL UNIT, assigned to Rosemount Incorporated.

Although multivariable transmitters and process devices implementing control functions have advanced the art of process control, there is still a need to accommodate applications requiring a relatively large number of sensors, as well as applications requiring enhanced control in the field.

SUMMARY

A field-mounted process device is provided. In one embodiment, the process device includes multiple isolated connections includes a connection that can be an input or an output. The given input or output connection can couple to multiple sensors or actuators, respectively. The process device is wholly powered through its communication interface. In one embodiment, the communication interface is in accordance with the Power-over-Ethernet (PoE) protocol. The process device includes a controller adapted to measure one or more characteristics of sensors coupled to an input connection and to control actuators coupled to an output connection. The process device also includes a loop communicator that is adapted to communicate over the communication interface. In another embodiment, the field-mounted process device includes a controller that is adapted to execute a user generated control algorithm relating process input information with process output commands.

DETAILED DESCRIPTION OF THE PREFERRED EMBODIMENTS

Figure 1:
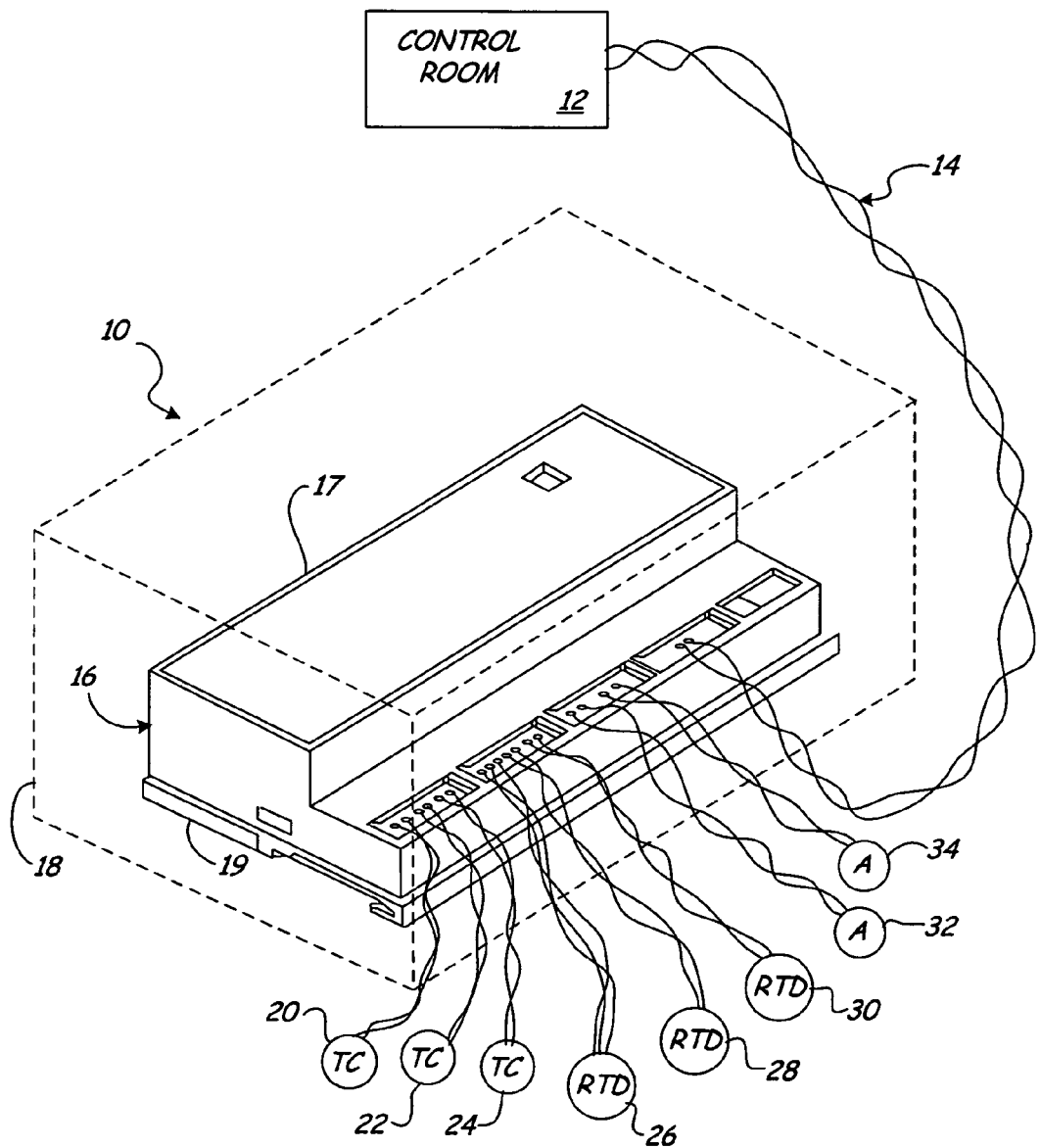
FIG. 1 is a diagrammatic view of a process control system employing a two-wire field mounted process device in accordance with an embodiment of the present invention.

A two-wire field mountable process device 16 shown in FIG. 1 is provided which can be adapted to execute sophisticated user generated control algorithms, much like those used with traditional programmable logic controllers. Embodiments can include input channels, output channels, and any combination of the two. Generally, each channel is isolated from the remainder of the process device. Such isolation removes ground loop errors that currently limit multiple input transmitters. Finally, power management is such that embodiments of the present invention are wholly powered by a two-wire process loop 14. These and other features will become apparent upon review of the figures and the related description provided below.

FIG. 1 is a diagrammatic view of process control system 10 which includes control room 12, process control loop 14 and process device 16. Process control system can comprise a single process device coupled to control room 12, however system 10 can also include hundreds of process devices coupled to one or more control rooms over a number of process control loops.

Control room 12 is typically a facility located away from device 16 that includes a microcomputer. A user stationed in control room 12 uses the microcomputer to interact with various process devices through process control loop 14 and thus controls the process(es) from the control room. For clarity, control room 12 is illustrated as a single block. However, in some control system embodiments, control room 12 may in fact couple process control loop 14 to a global computer network, such as the internet, so that users worldwide could access process device 16 from traditional web browser software.

Loop 14 can be a two-wire process control loop. A number of two-wire process communication protocols exist for communicating on loop 14, and any suitable protocol can be used. For example, the HART® protocol, the FOUNDATION™ Fieldbus protocol, and the Profibus-PA protocol can be used with embodiments of the present invention. Loop 14 provides power to connected process devices while providing communication between the various devices.

Process device 16 includes cover 17 and base 19 which are preferably constructed from a suitable plastic material. Base 19 is adapted to mate with an industry standard DIN rail for mounting. As will be described in more detail, device 16 is adapted to operate solely upon electrical power received through loop 14, and is adapted for field-mounting. Thus, device 16 is configured to withstand a relatively large temperature range (such as −40 to 85 deg. C.), mechanical vibrations, and relative humidity in excess of 90%. Such environmental resistance is effected primarily through the selection of robust components, as will be described later in the specification. Optional enclosure 18 (shown in phantom) provides added durability and can be any known enclosure such as a National Electrical Manufacturers Association (NEMA) enclosure, or an explosion-proof enclosure. The process device embodiment shown in FIG. 1 has a number of inputs and outputs, and includes suitable computing circuitry (shown in FIG. 2) to execute a user generated control algorithm. The algorithm is comprised of a number of logic statements relating specific input events to outputs controlled by device 16. The user can change the algorithm either by interfacing locally with device 16, or by communicating with device 16 over control loop 14. The algorithm can be generated using conventional logic generation software such as Relay Ladder Logic and Sequential Function Charts (SFC's). In this sense, device 16 can be considered a two-wire field-mountable programmable logic controller. Although the description will focus upon the embodiment shown in FIGS. 1 and 2, such description is provided for clarity, since embodiments employing solely inputs, or outputs are expressly contemplated. Traditionally devices with the computational power of device 16 could not be operated upon two-wire process control loops due to prohibitive power constraints.

Process device 16 is coupled to sensors 20, 22, 24, 26, 28 and 30 as well as actuators 32 and 34. Sensors 20, 22 and 24 are thermocouples, of known type, which are coupled to various process points to provide voltage signals based upon process variables at the respective process points. Resistance Temperature Devices (RTD's) 26, 28 and 30 are also coupled to various process points and provide a resistance that is based upon process temperature at the respective process points. RTD 26 is coupled to device 16 through a known three-wire connection and illustrates that various wiring configurations can be used with embodiments of the present invention. Actuators 32 and 34 are coupled to process device 16 and actuate suitable valves, switches and the like based upon control signals from device 16. As noted above, device 16 can execute a user generated control algorithm to relate specific input conditions to specific output commands. For example, device 16 may sense a process fluid temperature, and cause actuator 32 to engage a heater coupled to the process fluid in order to maintain the fluid temperature at a selected level.

Figure 2:
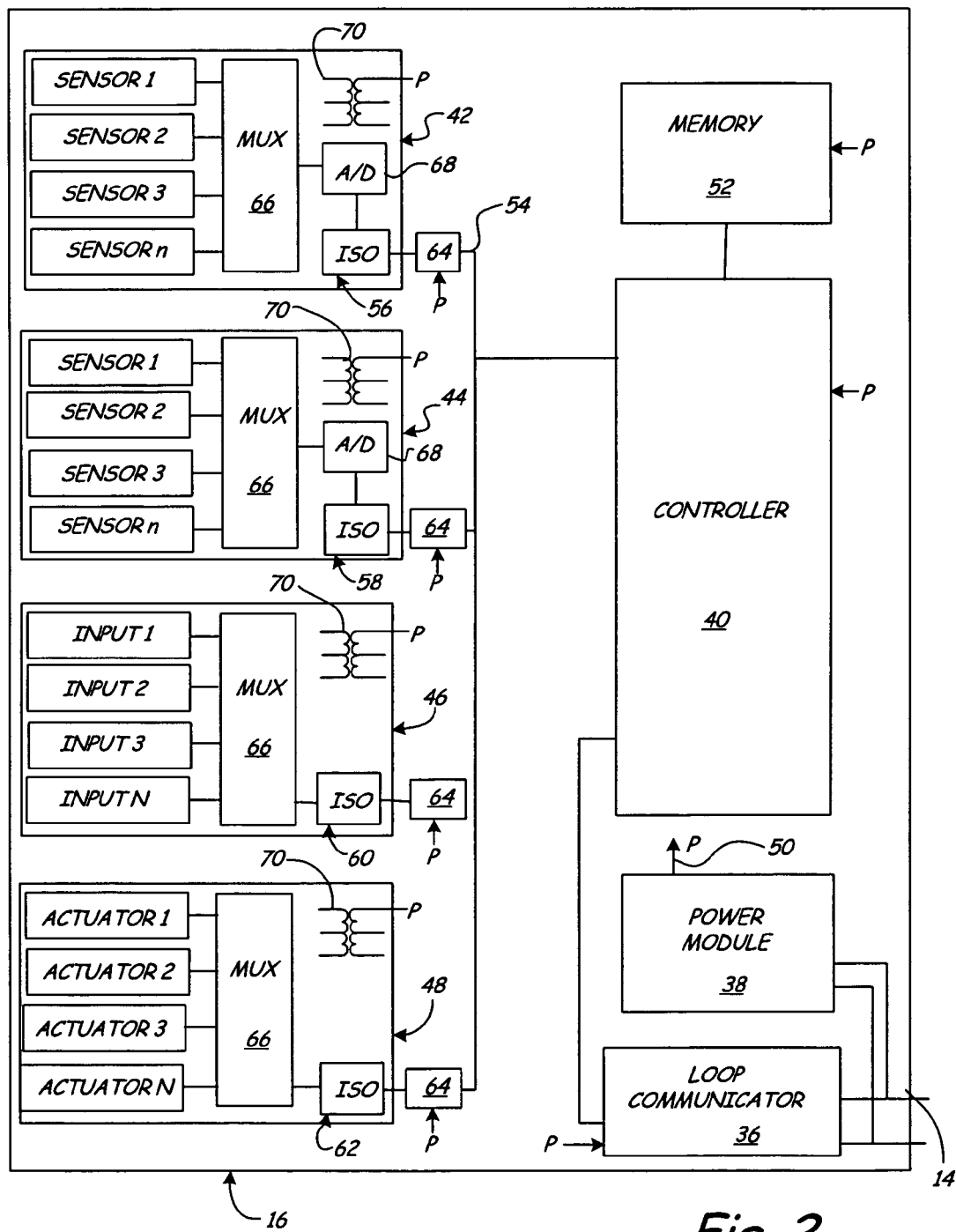
FIG. 2 is a system block diagram of the process device shown in FIG. 1.

FIG. 2 is a system block diagram of device 16 shown in FIG. 1. Device 16 includes loop communicator 36, power module 38, controller 40, and channels 42, 44, 46, 48, and memory 52. Loop communicator 36 is coupled to process control loop 14 and is adapted for bi-directional data communication over loop 14. Loop communicator 36 can include a known communication device such as a traditional FOUN- DATION™ Fieldbus communication controller or the like. Additionally, communicator 36 can include suitable isolation circuitry to facilitate compliance with the intrinsic safety specification as set forth in the Factory Mutual Approval Standard entitled "Intrinsically Safe Apparatus and Associated Apparatus for Use in Class I, II, and III, Division 1 Hazardous (Classified) Locations," Class Number 3610, published October 1988.

Power module 38 is coupled to loop 14 such that power module 38 provides power to all components of device 16 based upon power received from loop 14. Although power module 38 has a single arrow 50 indicating that power module 38 provides power to all components, it is noted that such power can be provided at multiple voltages. For example, power module 38 preferably includes a switching power supply that provides electrical power at a plurality of voltages. Thus, some components such as the A/D converters and the isolators can receive a higher voltage such as 4.9 volts, while low-power components such the controller 40, memory 52 and loop communicator 36 receive a lower voltage such as 3.0 volts. Additionally, power module 38 is preferably programmable to such an extent that at least one of the voltages provided can be varied. The selectable nature of power module 38 facilitates power management, which will be described later in the specification.

Controller 40 is coupled to memory 52 and executes program instructions stored therein. Memory 52 is preferably low-power memory operating on 3.0 volts, such as the model LRS1331, available from Sharp Electronics. Additionally, memory 52 can be "stacked" memory in which both flash memory and volatile memory are provided on a single memory module. The user generated control algorithm, or "program" executed by controller 40 can be changed by a user either by coupling to device 16 locally, or by accessing device 16 through loop 14. In some embodiments the program includes instructions that relate process event inputs to outputs determined by controller 40. In this sense, device 16 functions similarly to a programmable logic controller, which is a device that typically has not been robust enough for field-mounting, nor able to operate on the low power levels of two-wire field devices. However, by so providing the functions of a programmable logic controller, much more sophisticated process control algorithms can be implemented through a user friendly interface, such as Relay Ladder Logic or the like.

Controller 40 receives power from module 38, and communicates with loop communicator 36. Controller 40 preferably includes a low-power microprocessor such as the model MMC 2075 microprocessor available from Motorola Inc. of Schaumburg, Ill. Additionally, controller 40 preferably has a selectable internal clock rate such that the clock rate of controller 40, and thus the computing speed and power consumption, can be selected through suitable commands sent to device 16 over loop 14. Since higher clock speeds will cause controller 40 to draw more power, clock selection of controller 40, and selection of the voltage level provided by power module 38 to controller 40 are preferably performed in tandem. In this manner the processing speed and power consumption of device 16 are selectable and vary together.

Controller 40 is coupled to the various channels through interface bus 54, which is preferably a serial bus designed for high speed data communication such as a Synchronous Peripheral Interface (SPI). Channels 42, 44, 46 and 48 are coupled to bus 54 through communication isolators 56, 58, 60 and 62, respectively, which are preferably known optoisolators, but which can be any suitable isolation devices such as transformers or capacitors. In some embodiments, channels 42, 44, 46 and 48 provide data in parallel form, and parallel-serial converters 64 are used to translate the data between serial and parallel forms. Preferably, converters 64 are Universal Asynchronous Receiver/Transmitters (UART's).

Channel 42 is coupled to controller 40, and includes sensor terminals 1-n, multiplexer (MUX) 66, analog-to-digital (A/D) converter 68, communication isolator 56, and power isolator 70. It is contemplated that communication isolator 56 and power isolator 70 can be combined in a single circuit. Channel 42 is specifically adapted to measure a specific sensor type such as thermocouples, resistance temperature devices, strain gauges, pressure sensors, or other sensor type. Each sensor terminal is adapted to couple a single sensor, such as a thermocouple, to multiplexer 66. Multiplexer 66 selectively couples one of the sensors to A/D converter 68 such that a characteristic of the sensor (voltage for a thermocouple) is measured and communicated to controller 40 through isolator 56 and UART 64. Power for channel 42 is received from power module 38 through power isolator 70. Power isolator 70 is preferably a transformer, but can be any suitable device. Those skilled in the art will appreciate that communication isolator 56 and power isolator 70 cooperate to ensure that channel 42 is electrically isolated from the rest of device 16.

Channel 44 is similar to channel 42, and like components are numbered similarly. Channel 44 can be configured to measure sensors of a different type than that of channel 42. For example, in one embodiment, channel 42 is configured to measure the voltage of thermocouples, and channel 44 is configured to measure the resistance of RTD'S. Each sensor terminal in channel 44 is thus configured to couple to an RTD in a two, three, or four-wire (Kelvin) connection. Because channels 42 and 44 are each electrically isolated from the rest of device 16, coupling a first independently grounded sensor to channel 42, and a second independently grounded sensor to channel 44 does not result in the generation of undesirable ground loop errors. Additionally, since each channel can be configured for a specific type of sensor, which can be optimized for a specific application, parameters such as A/D precision and conversion rate can be tailored for the specific sensor type. For example, a channel designed for high-precision may employ an A/D converter of configured to provide a very high accuracy having a relatively slower conversion time. Conversely, a channel designed for sensors that measure a process variable that can changes quickly can employ a lower precision high speed A/D converter. Essentially, any sensor input can be switched between operation with resistance-type sensors to operation with voltage-type sensors based upon configuration information received from controller 40. Controller 40 can provide the configuration information based upon information received over loop 14, or through a local input (not shown). Additionally, controller 40 can provide configuration information to the channels to adjust analog-to-digital sampling rates for each channel, or even for each sensor. This is particularly advantageous where sensor rates of change are anticipated based upon information known about the process.

Channel 46 is similar to channels 42 and 44, however since channel 46 is configured to receive digital inputs, it does not include an analog-to-digital converter. As illustrated, inputs 1-n are coupled to multiplexer 66 which conveys the signal of a selected input to bus 54 through communication isolator 60 and UART 64. In some digital input embodiments, the input level may be such that the digital inputs could be provided directly to UART 64 through isolator 60. Digital inputs are generally indicative of logic-type signals such as contact closure in limit switches as the like. However, digital inputs 1-n can also be coupled to digital outputs of other process devices such that the inputs represent logic signals such as alarms or other Boolean type signals.

Channel 48 is similar to channel 46, but essentially operates in reverse compared to channel 46. Thus, serial information sent to channel 48 through the UART is converted into parallel form, and conveyed across communication isolator 62 to set individual actuator outputs. Thus, logic signals are sent to the terminals labeled ACTUATOR 1-n to cause actuators coupled to such terminals (not shown) to engage or disengage as desired. Such actuators can be any suitable device such as valve controllers, heaters, motor controllers and any other suitable device. Essentially, any device that is addressable based upon a logic type output is an actuator.

Figure 3:
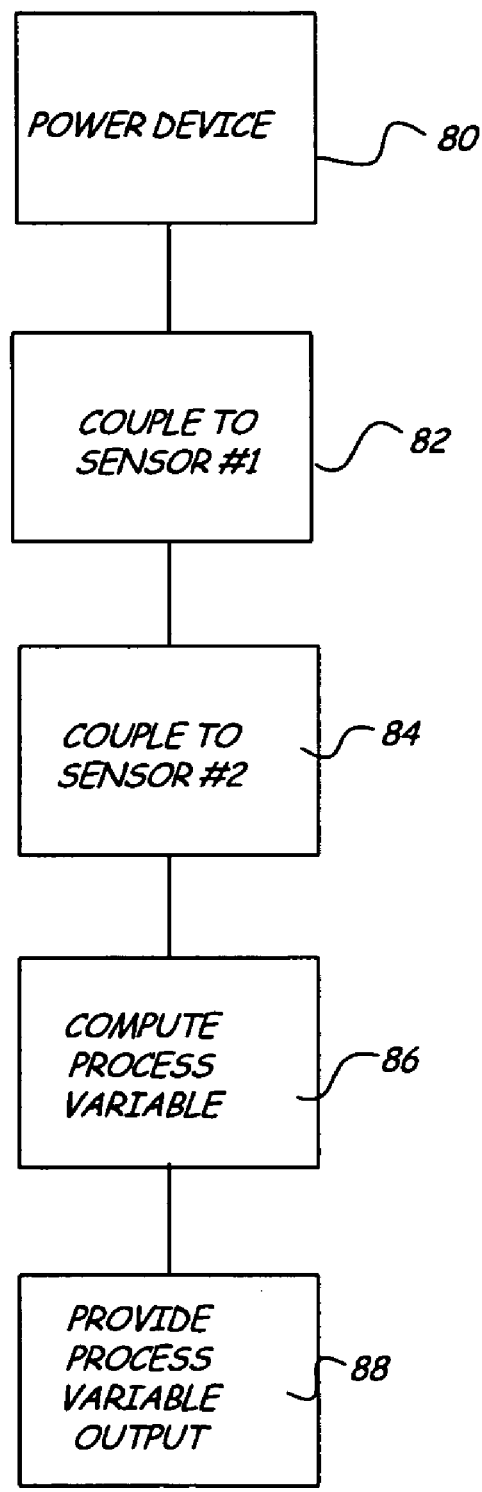
FIG. 3 is a system block diagram of a method of providing a process variable with a field-mounted process device in accordance with an embodiment of the present invention.

FIG. 3 is a system block diagram of a method of providing a process variable with a field-mounted process device in accordance with an embodiment of the present invention. The method begins at block 80 where a field-mountable process device is wholly powered by a two-wire process control loop. At block 82, the process device is coupled to a first sensor through a first isolated input channel. A sensor signal is acquired through the first isolated input channel, which signal is indicative of a process variable. At block 84, the process device is coupled to a second sensor through a second isolated input channel in order to acquire a second sensor signal. Since the first and second input channels are isolated, independent grounding of the first and second sensors will not cause undesirable ground loop errors. At block 86, the process device computes a process variable based upon one or both of the sensor signals. Moreover, although the method is described with respect to two sensors, a number of additional sensors could be used such that the process variable would be a function of any number of sensor signals. For example, the process device could average the values of the sensor, provide their difference, standard deviation, or any other appropriate function. At block 88, the computed process device is output. Such output can be in the form of information sent over the process control loop, a local display, or a local output effected through an output channel.

Figure 4:
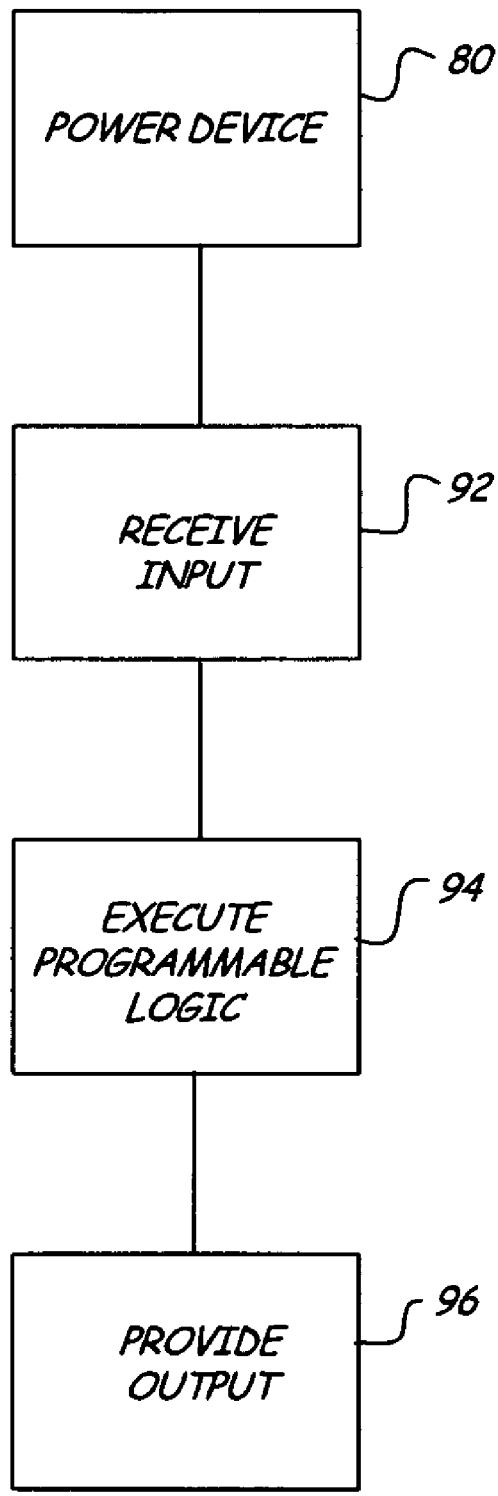
FIG. 4 is a system block diagram of a method of operating a field-mounted process device in accordance with an embodiment of the present invention.

FIG. 4 is a system block diagram of a method of operating a field-mounted process device in accordance with an embodiment of the present invention. At block 80, the device is wholly powered by the two-wire process control loop. At block 92, the device receives an input. Such input can be in the form of signals received through input channels, such as the multiple isolated input channels described above, in the form of process information received through the two-wire process control loop, in the form of a local input, or any combination of input signals and information. At block 94, the device executes user-programmable logic to relate the input information to one or more process outputs. The user-programmable logic can be simple or complex algorithms such as ladder logic, SFC's, fuzzy logic, Adaptive Control, or neural networks and the like. At block 96, the device provides the output determined via operation of the user-programmable logic. The output can be a local output, either digital or analog, or the output can be sent as information over the two-wire process control loop.

Figure 5:
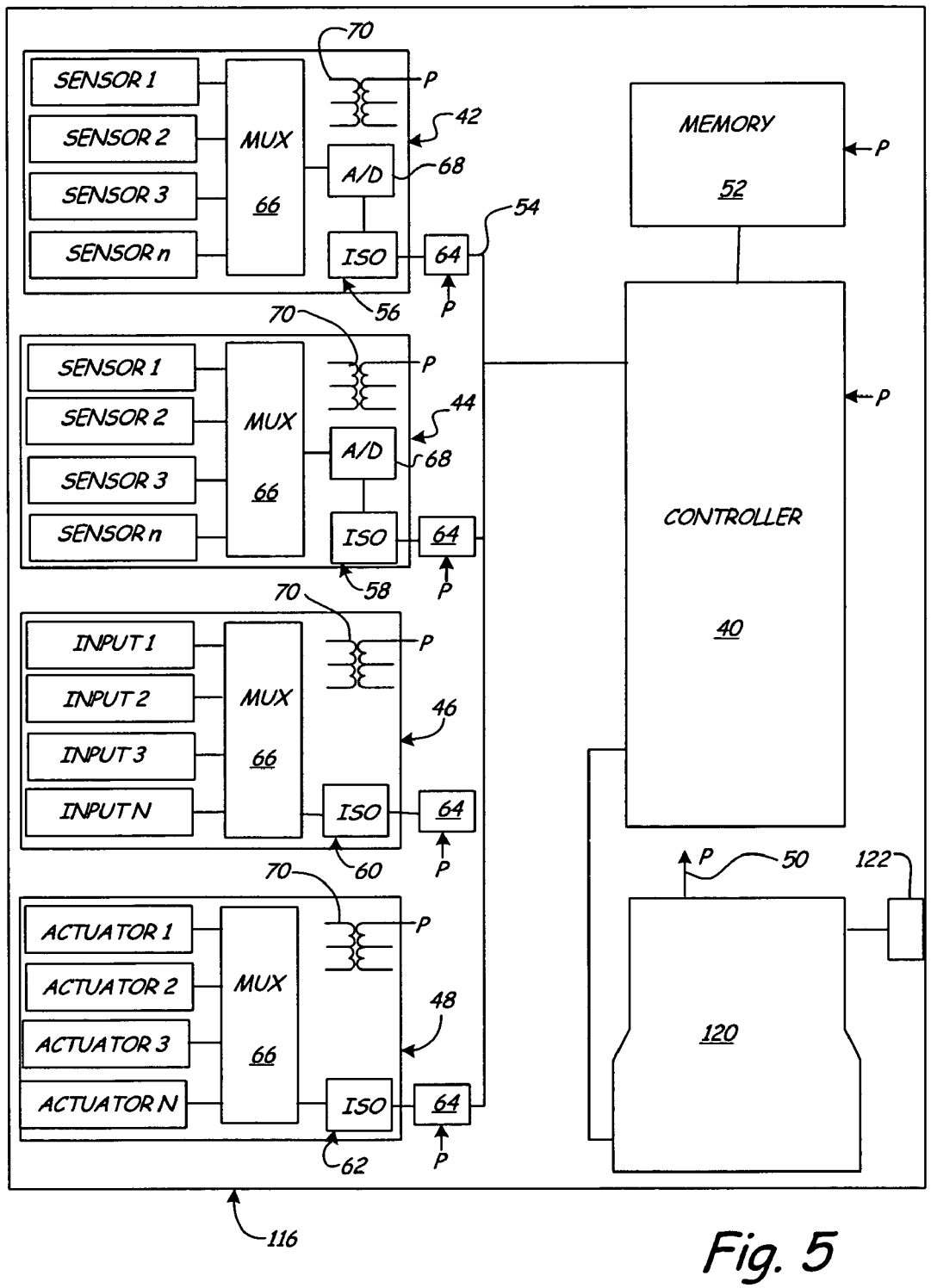
FIG. 5 is a system block diagram of a field-mounted process device in accordance with another embodiment of the present invention.

FIG. 5 is a system block diagram of a field-mounted process device in accordance with another embodiment of the present invention. Device 116 bears many similarities to device 16 (shown in FIG. 2) and like components are numbered similarly. Device 116 employs Power Over Ethernet (PoE) module 120, which is coupled to I/O port 122. PoE module is adapted to communicate in accordance with the known Ethernet protocol. In addition, PoE module 120 provides a source of power for the remaining components within device 116. This can be accomplished in a number of ways. For example, unused pairs of wires in a traditional unshielded twisted pair (UTP) cabling, such as Category 5 cable, can be used to provide power. However, it is also contemplated that the same wire pairs that provide communication can also be used to obtain power for the device. Embodiments described above have provided field devices that are powered by their communication interfaces. Similarly, device 116 is powered by its communication interface. Preferably, port 122 is a traditional RJ-45 port. However, port 122 may be adapted for field mounting with additional insulation, overmolding, heat sinking et cetera. PoE module 120 provides controlled power (around 13 watts) to the components within device 116. In fact, providing analog input connections, device 116, in some embodiments, is able to drive one or more 4–20 mA loops with the power received via PoE module 120.

By providing Ethernet compliant communication, communication speeds of 10 or 100 megabits can be realized for process information. Additionally, the ubiquity of Ethernet communication may be advantageous in installations where Fieldbus, or other process communication protocols are not available.

Although the present invention has been described with reference to embodiments of a process device having four connections, workers skilled in the art will recognize that changes may be made in form and detail without departing from the spirit and scope of the invention, which are defined by the appended claims. For example, although various modules have been illustrated and described separately, it is expressly contemplated that some such modules can be physically embodied together, such as on an Application Specific Integrated Circuit. Further, although controller 40 is described as a single module, its functions can be distributed upon multiple microprocessors such that one microprocessor could provide low-level I/O interaction, such as calibration, linearization and the like, while a second microprocessor executes the user-generated control algorithm. Additionally, although the description has focussed upon inputs and outputs being provided through the disclosed connections, it is expressly contemplated that some process inputs or process outputs could be communicated from/to other process devices through the communication interface.

What is claimed is:

1. A field-mountable process device comprising:
   a power over Ethernet module coupled to a port, the module being adapted to wholly power the process device with power received through the port, and to communicate in accordance with Ethernet communication;
   a controller coupled to the power over Ethernet module and configured to measure or control industrial processes;
   a first connection operably coupled to the controller and the power over Ethernet module through a power isolator and a communication isolator, the first connection being wired to at least one sensor through a plurality of first terminals;
   a second connection operably coupled to the controller and the power over Ethernet module through a power isolator and a communication isolator, the second connection being wired to at least a second process interface element through a plurality of second terminals;
   a first multiplexer coupled to the plurality of first terminals; and
   a first analog-to-digital converter coupled to the controller and the first multiplexer, the first converter being adapted to convert an analog signal from one of the plurality of first terminals, into a digital value and to convey the digital signal to the controller.

2. The device of claim 1, wherein the second process interface element is a sensor, and the device further includes:
- a second multiplexer coupled to the plurality of second terminals;
- a second analog-to-digital converter coupled to the controller and the second multiplexer, the second converter being adapted to convert an analog signal from one of the plurality of second terminals, into a digital value and to convey the digital signal to the controller.

3. The device of claim 1, wherein the second process interface element provides a digital output, and the process device further includes a second multiplexer coupled to the plurality of second terminals to receive a plurality of digital inputs and convey signals to the controller based upon at least one of the digital inputs.

4. The device of claim 1, wherein the second process interface element is an actuator, and the process device further includes a second multiplexer coupled to the controller and the second plurality of terminals to provide a plurality of digital outputs on the plurality of second terminals based upon a command signal from the controller.

5. The device of claim 1, wherein the controller is a microprocessor.

6. The device of claim 5, wherein the microprocessor is a low-power microprocessor.

7. The device of claim 5, wherein the microprocessor has a clock speed that is user selectable.

8. The device of claim 1, and further comprising memory coupled to the controller and adapted to store a user-generated control algorithm.

9. The device of claim 8, wherein the control algorithm comprises a sequence of logic conditions.

10. The device of claim 8, wherein the memory is low-power memory.

11. The device of claim 8, wherein the memory is stacked memory.

12. The device of claim 8, wherein the controller is adapted to continuously execute the control algorithm.

13. The device of claim 1, wherein the device is housed within an explosion-proof enclosure.

14. The field-mounted process device of claim 1, wherein the port is an RJ-45 port.

* * * * *